US012584241B2

(12) United States Patent
Ravi

(10) Patent No.: US 12,584,241 B2
(45) Date of Patent: Mar. 24, 2026

(54) BATCH MODE SILICON CARBIDE EPITAXIAL REACTOR

(71) Applicant: ThinSiC Inc., Santa Clara, CA (US)

(72) Inventor: Tirunelveli Subramaniam Ravi, San Jose, CA (US)

(73) Assignee: ThinSiC Inc., Santa Clara, CA (US)

( * ) Notice: Subject to any disclaimer, the term of this patent is extended or adjusted under 35 U.S.C. 154(b) by 512 days.

(21) Appl. No.: 18/141,428

(22) Filed: Apr. 30, 2023

(65) Prior Publication Data

US 2024/0360589 A1      Oct. 31, 2024

(51) Int. Cl.

| | |
|---|---|
| *C30B 25/12* | (2006.01) |
| *C23C 16/32* | (2006.01) |
| *C23C 16/44* | (2006.01) |
| *C23C 16/455* | (2006.01) |
| *C23C 16/458* | (2006.01) |
| *C23C 16/46* | (2006.01) |
| *C30B 25/10* | (2006.01) |
| *C30B 25/14* | (2006.01) |
| *C30B 29/36* | (2006.01) |
| *H10P 72/76* | (2026.01) |

(52) U.S. Cl.
CPC ............ *C30B 25/12* (2013.01); *C23C 16/325* (2013.01); *C23C 16/4412* (2013.01); *C23C 16/45504* (2013.01); *C23C 16/4587* (2013.01); *C23C 16/46* (2013.01); *C30B 25/10* (2013.01); *C30B 25/14* (2013.01); *C30B 29/36* (2013.01); *H10P 72/7621* (2026.01)

(58) Field of Classification Search
CPC ........... H01L 21/68771; C23C 16/4587; C23C 16/45504; C23C 16/4412; C23C 16/235; C30B 29/36; C30B 25/12; C30B 25/14
See application file for complete search history.

(56) References Cited

U.S. PATENT DOCUMENTS

| | | | |
|---|---|---|---|
| 9,255,346 | B2 | 2/2016 | Sivaramakrishnan et al. |
| 10,337,103 | B2 | 7/2019 | Hyon et al. |
| 10,947,640 | B1 | 3/2021 | Ravi et al. |
| 11,149,350 | B2 | 10/2021 | Adachi et al. |
| 11,293,097 | B2 | 4/2022 | Jung et al. |
| 2017/0037514 | A1 | 2/2017 | Sivaramakrishnan et al. |
| 2020/0032393 | A1 | 1/2020 | Jung et al. |
| 2022/0064819 | A1 | 3/2022 | Ravi et al. |
| 2023/0073259 | A1* | 3/2023 | Chandrasekharan ........................ H01J 37/32715 |

* cited by examiner

*Primary Examiner* — Joseph A Miller, Jr.

(57)      ABSTRACT

A batch mode SiC (Silicon Carbide) epitaxial reactor comprising an inlet gas manifold, an inlet heat exchanger coupled to the inlet gas manifold, a plurality of removable vertical susceptors configured to couple to the inlet heat exchanger, a plurality of exhaust heat exchangers coupled to the plurality of removable vertical susceptors, and a scrubber coupled to the plurality of exhaust heat exchangers. Each removable vertical susceptor is configured to hold at least two SiC wafers tilted in a vertical fixed position relative to a flow of heated gases output by the inlet heat exchanger. The plurality of exhaust heat exchangers are configured to heat hydrogen gas. The heated hydrogen gas is configured to couple to the inlet heat exchanger to heat gases provided through the inlet gas manifold to grow SiC on the plurality of SiC wafers in the plurality of removable vertical susceptors thereby reducing energy consumption.

20 Claims, 8 Drawing Sheets

BATCH MODE SILICON CARBIDE EPITAXIAL REACTOR

FIELD

This invention relates to semiconductor device manufacture, and in particular to growing a silicon carbide epitaxial layer on multiple silicon carbide wafers simultaneously.

BACKGROUND

The use of wide bandgap (WBG) semiconductors has increased dramatically in recent years in power electronics. The ability of WBG semiconductors to operate efficiently at higher voltages, powers, temperatures, and switching frequencies has reduced cooling requirements, lowered part counts, and minimized the number of passive components needed. WBG power electronics can further reduce the footprint and system cost of various renewable energy electrical equipment such as motor drivers and inverters.

Among the WBG semiconductors for power electronics, Silicon Carbide (SIC) has now been increasingly used for high voltage drivers (>1200V). However, unlike silicon, the cost of a final device for WBG semiconductor devices is dominated by the cost of the materials. The materials include the substrate and the active layer(s) grown by epitaxy. Typically, the substrate by itself contributes to over half of the cost of a finished WBG semiconductor device.

From the substrate perspective, 4H-Silicon carbide (SiC) single crystal substrates have been used for the manufacture of both SiC and GaN devices since SiC and GaN epitaxial layers can be grown with reduced defects on SiC substrates. While the SiC substrate quality has dramatically improved in recent years, the cost has not come down since substrate fabrication is a complex process starting with vapor phase ingot growth, followed by ingot cropping, then wire sawing of individual wafers, and finally grinding and polishing of the substrate. At this time, there has been no proven practical method to eliminate any of these foregoing steps.

As mentioned previously, the growth of an epitaxial layer on SiC substrates is also a substantial cost factor in the manufacture of SiC devices. Currently, many manufactures use single wafer SiC epitaxial reactors to grow SiC epitaxial layers. The single wafer SiC epitaxial reactors can have a high capital cost and low throughput. There have also been horizontal carousel batch type SiC epitaxial wafer reactors that have been introduced that can process multiple SiC wafers simultaneously. These batch type SiC epitaxial reactors can have a substantial capital cost with only minimal increase in throughput compared to single wafer SiC epitaxial reactors.

As devices are formed for high current operation on a semiconductor substrate for WBG semiconductors, defectivity of the semiconductor substrate will play a role in yield and performance as larger die sizes will contribute to significant yield loss and potential lower reliability. Therefore, to maximize die yield, any cost reduction activity regarding the SiC substrate and the growth of SiC epitaxial layers is paramount while also maintaining low defect densities in the active epitaxial layer.

Accordingly, it is desirable to provide a system that lowers SiC epitaxial wafer processing costs while improving device performance to enable new uses for high power high efficiency semiconductor devices.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figure 1:
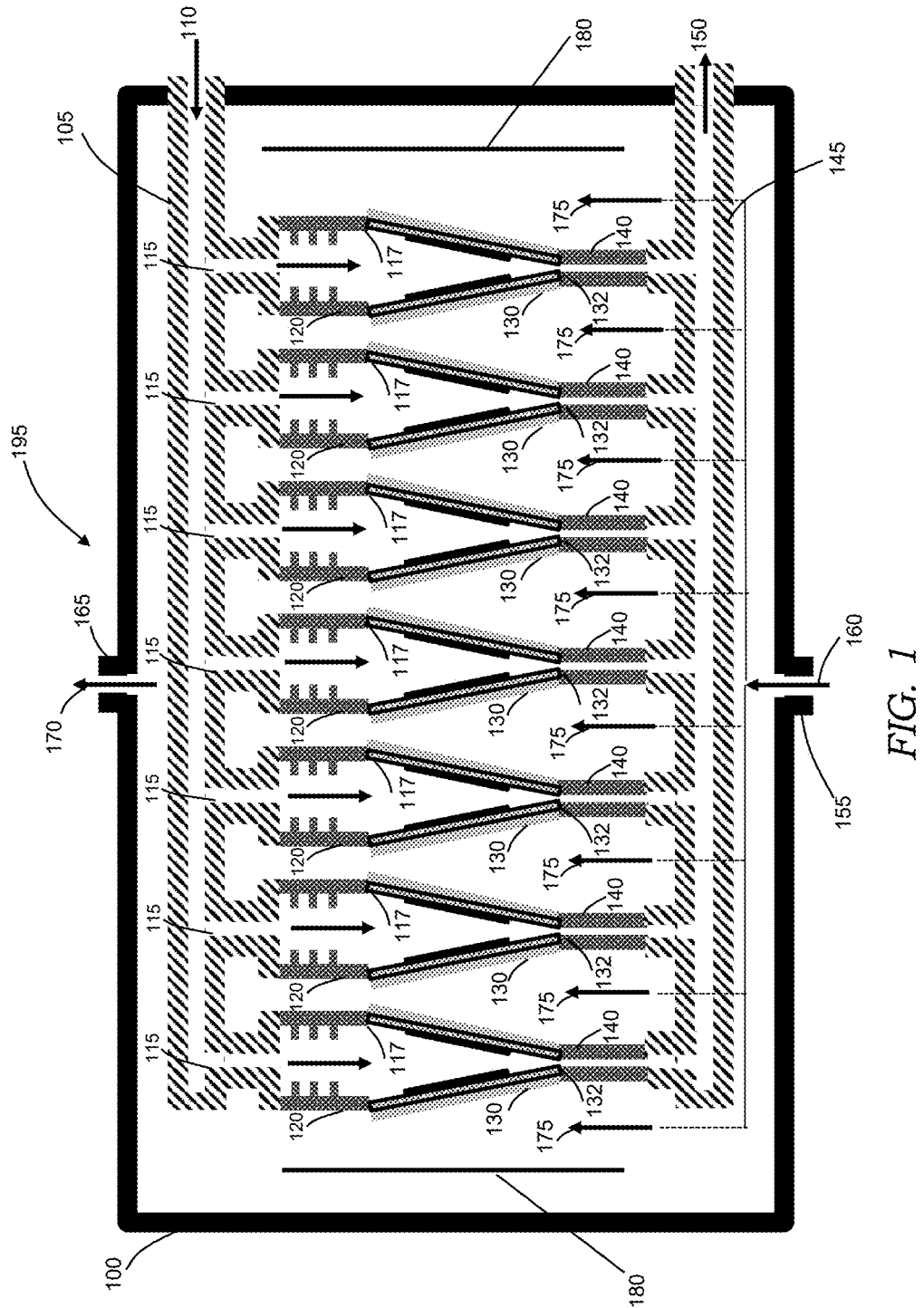
FIG. 1 is an illustration of a modular Silicon Carbide (SiC) epitaxial reactor in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment of a high throughput vertical epitaxial reactor for growth of silicon carbide layers. The epitaxial reactor is designed to be modular so that it can be scaled using the same basic configuration for high throughput operation.

FIG. 1 is an illustration of a modular Silicon Carbide (SiC) epitaxial reactor 195 in accordance with an example embodiment. Modular silicon carbide epitaxial reactor 195 comprises a Chemical Vapor Deposition (CVD) chamber 100, where the growth of silicon carbide layers on silicon carbide substrates or wafers using epitaxy is performed. High temperature processing occurs within CVD chamber 100. CVD chamber 100 will have ports for the inflow and outflow of gases used to grow one or more epitaxial layers as will be disclosed in more detail herein below. In the example embodiment, modular silicon carbide epitaxial reactor 195 includes a number of modules and components required for the growth of silicon carbide layers on silicon carbide wafers. Typically, there will be three or more modules or a minimum of two modules in modular SiC epitaxial reactor 195. In one embodiment, each active module is operated under substantially identical conditions as will be disclosed herein. In the example embodiment, modular SiC epitaxial reactor 195 has seven active modules each holding a plurality of wafers. In one embodiment, operation of each active module under substantially identical conditions can be extended in a three dimensional array should modular SiC epitaxial reactor 195 comprise rows and columns of modules. An inlet gas manifold 105 is used to introduce process gases 110 required for the growth of one or more silicon carbide layers on two or more SiC wafers per module. In the example embodiment, inlet gas manifold 105 is used to introduce process gases 110 into CVD chamber 100 for the purpose of growing silicon carbide epitaxial layer. In the example embodiment, process gases 110 comprises TCS (Tri-Chloro Silane), $C_3H_8$ (propane) and $H_2$ (hydrogen). Tri-Chloro Silane, propane and hydrogen react in CVD chamber 100 to produce epitaxial layers of silicon carbide on silicon carbide wafers or substrates. In addition, process gases 110 can comprise dopant gas sources such as $N_2$ for n-type doping using Nitrogen and TriMethyl Aluminum for p-type doping using Aluminum.

Inlet gas manifold 105 has a plurality of outputs 115 coupled to a plurality of inlet heat exchangers 120 to heat process gases 110 to a predetermined temperature by using the principle of heat transfer as explained subsequently in more detail. Plurality of inlet heat exchangers 120 have a plurality of outputs 117 that couple to a plurality of removable vertical susceptors 130. Each vertical susceptor of plurality of removable vertical susceptors 130 are configured to hold at least two silicon carbide wafers for batch mode epitaxial growth. The details of the design of the plurality of removable vertical susceptors 130 are described subsequently in detail in FIGS. 2-7. Each vertical susceptor of plurality of removable vertical susceptors 130 comprises at least two walls that act as a wafer carrier and is configured to be heated to a predetermined temperature by a heater underlying each susceptor wall which acts as a wafer carrier. In the example embodiment, each vertical susceptor of plurality of removable vertical susceptors 130 comprises an enclosure for allowing a flow of process gases 110 that are heated to flow through each of the plurality of removable vertical susceptors. In one embodiment, the at least two walls acting as a wafer carrier of each removable vertical susceptor of the plurality of removable vertical susceptors is configured such that a surface of each silicon carbide wafer is tilted at an angle to the vertical such that the silicon carbide wafer is held in place by gravity and also such that the angle of the tilt compensates for the depletion of the reactants in the bottom portion of the vertical susceptor of the plurality of removable vertical susceptors 130. How the silicon carbide wafer is held in place by gravity will be disclosed in detail herein below. Also, by holding silicon carbide wafers in each removable vertical susceptor of the plurality of removable vertical susceptors 130 at a vertical angle, the deposition of any particulates or unreacted material on the surface of the silicon carbide wafers is reduced considerably, leading to higher quality epitaxial layers with high yield and low defectivity. In one embodiment, laminar flow of process gases 110 that is heated flowing over the surface of the silicon carbide wafers in the plurality of removable vertical susceptors 130 support movement of the deposition of particulates or unreacted material such that they will exit each removable vertical susceptor of the plurality of removable vertical susceptors 130 instead of forming on the silicon carbide wafers.

In each of the removable vertical susceptors of the plurality of removable vertical susceptors 130, chemical reactions occur leading to the deposition of silicon carbide on the silicon carbide wafers carried by the walls of the susceptors using process gases 110 heated to a predetermined temperature by plurality of inlet heat exchangers 120. In each of the vertical susceptors of the plurality of removable vertical susceptors 130, process gases 110 are also heated to high temperatures by the heaters underlying the walls of the vertical susceptor with the wafer carriers. In one embodiment, each silicon carbide wafer in the plurality of removable vertical susceptors 130 is also heated by the heaters underlying the walls of each removable vertical susceptor holding each silicon carbide wafer. In one embodiment, process gases 110 are preheated to the predetermined temperature using inlet heat exchanger 120 and then further heated to a desired temperature by the heater underlying each susceptor wall in the plurality of removable vertical susceptors 130. The temperature range of the reaction is between (1500-1900° C.) to initiate and maintain the reaction for growing an epitaxial layer of silicon carbide. The heater underlying each susceptor wall holding a silicon carbide wafer heats the wafer carrier to the desired process temperature using resistive heating methods. The details of the heater design and operation is described in more detail in FIGS. 2-7. In the example embodiment, process gases 110 comprising TCS (Tri-Chloro Silane), $C_3H_8$ (propane) and $H_2$ (hydrogen) react at the high temperature range of (1500-1900° C.) to initiate epitaxial growth and deposition of silicon carbide on the surface of silicon carbide wafers carried by each removable vertical susceptor of the plurality of removable vertical susceptors 130. In the example embodiment, process gases 110 comprising TCS is the source of the silicon in the silicon carbide while propane is the source of the carbon in the carbon in the silicon carbide. The disassociation of TCS and propane along with the hydrogen in process gases 110 enable the epitaxial growth of silicon carbide on the surface of each silicon carbide wafer in plurality of removable of vertical susceptors 130. Unreacted gases from the reaction of process gases 110 exit through the plurality of removable vertical susceptors 130. In addition, dopant gas sources such as nitrogen and TriMethyl Aluminum may be incorporated in process gases 110. The operating pressure of CVD chamber 100 of modular silicon carbide epitaxial reactor 195 can range between (40-250) mbar. It should be noted that other dopant gas sources or combinations can be used in accordance to one skilled in the art depending on the epitaxy being grown. This configuration of CVD chamber 100 can be utilized for epitaxial growth of other semiconductor materials such as silicon, germanium, boron nitride among others. For each epitaxial growth in CVD chamber 100, combination of process gases 100 may be different. For example, for silicon epitaxy utilizing CVD chamber 100, process gases 110 may comprise dichlorosilane, trichlorosilane, hydrogen among others and dopant gases may comprise diborane for p-type doping and phosphine or arsine for n-type doping.

Tilting walls holding silicon carbide wafers of plurality of removable vertical susceptors 130 to an angle to the vertical, compensates for the depletion of process gases 110 as it flows vertically downwards across the surface of silicon carbide wafers carried by plurality of removable vertical susceptors 130. This compensation occurs by the reduction of the thickness of the boundary layer coupled to the surface of each vertically supported silicon carbide wafer. This tilting of the angle of the vertical surface of the silicon carbide wafer to the direction of flow of process gases 110 ensures that the uniformity of the epitaxial growth rate is maintained even if there is depletion of process gases 110 in the lower part of the vertical susceptor as they flow over the reaction surface. The details of the design and operation of the epitaxial growth of the silicon carbide layer on the silicon carbide wafers held in plurality of removable vertical susceptors 130 will be described in more detail in FIGS. 2-7.

Plurality of removable vertical susceptors 130 has a plurality of outputs 132 that are coupled to a plurality of exhaust heat exchangers 140. The heat from the output of plurality of removable vertical susceptors 130 is exchanged in the plurality of exhaust heat exchangers 140 and used to heat hydrogen gas 175 which is flowing in the opposite direction as process gases 110 through plurality of removable vertical susceptors 130. Unreacted process gases 150 flowing into the plurality of outputs 132 of plurality of removable vertical susceptors 130 are coupled to plurality of exhaust heat exchangers 140. In one embodiment, unreacted process gases 150 have passed by the SiC wafers in plurality of removable vertical susceptors 130 such that the unreacted process gases 150 can no longer form SiC epitaxy on the SiC wafers. As mentioned, heat from unreacted process gases 150 is scavenged and reused to heat hydrogen gas 175 thereby improving the efficiency of modular Silicon Carbide (SiC) epitaxial reactor 195. The process temperatures for the growth of SiC epitaxial layers is so high that the energy savings are substantial. Similarly, operating in batch mode further reduces energy costs. In the example embodiment, unreacted process gases 150 exiting plurality of outputs 132 of plurality of removable vertical susceptors 130 are flowing vertically in a downward direction. Conversely, hydrogen gas 175 flowing outside or exterior to plurality of removable vertical susceptors 130 is flowing in an opposite or upwards vertical direction thereby carrying heat exchanged by plurality of exhaust heat exchangers 140 to hydrogen gas 175 vertically upwards. The heated hydrogen gas flows upwards and couples with inlet heat exchanger 120 to transfer heat to incoming process gases 110 to a predetermined temperature thereby reducing energy consumption of modular silicon carbide epitaxial reactor 195 as mentioned herein at substantial operating cost savings.

After transferring heat to plurality of exhaust heat exchangers 140 and thereby to hydrogen gas 175, unreacted process gases 150 are coupled to an output gas manifold 145 by coupling outputs of plurality of exhaust heat exchangers 140 to output gas manifold 145. In one embodiment, output gas manifold 145 is coupled to a scrubber with an exhaust port to remove and treat unreacted process gases 150. The scrubber coupled to output gas manifold 145 is configured to remove particulates that may be generated during the epitaxial growth process and also to treat the unreacted process gases 150 from plurality of exhaust heat exchangers 140.

In one embodiment, CVD chamber 100 comprises an inlet port 155 that enables incoming hydrogen gas 160 to be introduced into CVD chamber 100 to act as a medium for transferring heat from plurality of exhaust heat exchangers 140 to inlet heat exchanger 120 to preheat incoming process gases 110. Process gases 110 heated to the predetermined temperature flows through inlet heat exchanger 120, plurality of outputs 117 to plurality of removable vertical susceptors 130 to support formation of epitaxy on SiC wafers therein. In one embodiment, incoming hydrogen gas 160 introduced through inlet port 155 flows around output gas manifold 145 and plurality of exhaust heat exchangers 140 and transfers heat from unreacted process gases 150 exiting from plurality of outputs 132 of plurality of removal vertical susceptors 130 via plurality of exhaust heat exchangers 140 to be coupled via hydrogen gas 175 to inlet heat exchanger 120 as shows by dotted arrows. After transferring heat from hydrogen gas 175 to inlet heat exchanger 120, cooled hydrogen gas 170 that has been cooled flows through outlet port 165 of CVD chamber 100 to be treated, recirculated, or both back to inlet port 155 of CVD chamber 100. The gas flow comprising process gases 110 through inlet heat exchanger 120, plurality of removable vertical susceptors 130, plurality of exhaust heat exchangers 140, and output gas manifold 145 is kept substantially isolated from hydrogen gas 175 flowing outside by using a higher pressure for hydrogen gas 175 than for process gases 110 flowing in inlet heat exchanger 120, plurality of removable vertical susceptors 130, plurality of exhaust heat exchangers 140, and output gas manifold 145 such that the pressure differential isolates process gases 110 inside from hydrogen gas flowing outside.

Plurality of removable vertical susceptors 130 are coupled to plurality of outputs 117 of inlet heat exchanger 120 and plurality of outputs 132 of plurality of removable vertical susceptors 132 are coupled to a plurality of inputs of plurality of exhaust heat exchangers 140 such that they can be removed periodically to be cleaned and refurbished when the thickness of silicon carbide deposited on the walls of plurality of removable vertical susceptors 130 exceed a predetermined thickness. By replacing plurality of removable vertical susceptors 130 with a new or refurbished set of susceptors, the operation of modular silicon carbide epitaxial reactor 195 can be more efficient leading to higher uptime with consequent lower cost of ownership. Similarly, plurality of removable vertical susceptors 130 can be removed from CVD chamber 100 to remove SiC wafers with an epitaxial layer formed thereon and install new SiC wafers to form an epitaxial layer.

To ensure that the temperature inside CVD chamber 100 is kept substantially uniform, and more specifically each removable vertical susceptor of plurality of removable vertical susceptors 130 is operated substantially identical, a heat shield 180 is used in the example embodiment. Heat shield 180 is made of an IR reflective material and is used to reflect any radiant thermal energy back to the center of modular silicon carbide epitaxial reactor 195 to minimize the thermal variations and improve growth uniformity of the epitaxial process in plurality of removable vertical susceptors 130. In other embodiments, to improve thermal uniformity inside CVD chamber 100, a set of dummy vertical susceptors with heaters but no process gases flowing in them may be used in proximity to the walls of CVD chamber 100 while plurality of removable vertical susceptors 130 with process gases 110 are placed internal to CVD chamber 100 with more uniform temperature distribution to improve the epitaxial deposition process.

Figure 2:
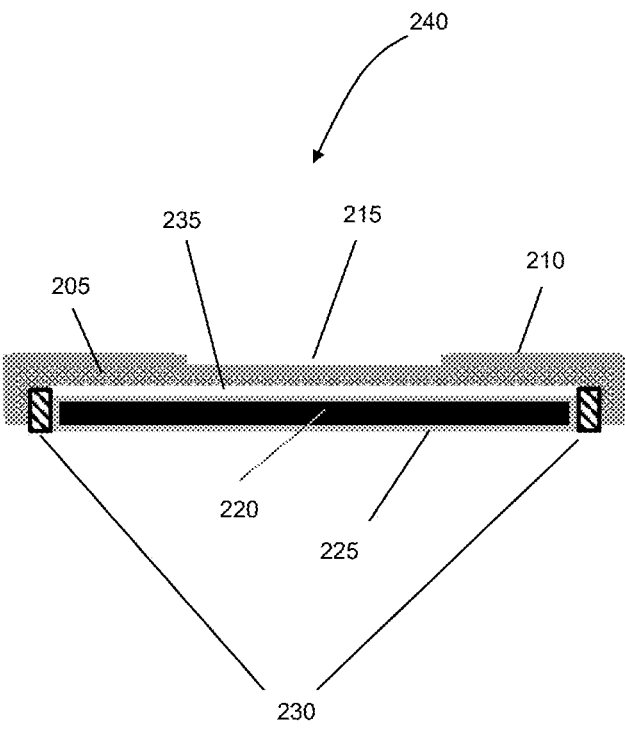
FIG. 2 is an illustration of a wall of a vertical susceptor of a plurality of removable vertical susceptors in accordance with an example embodiment.

FIG. 2 is an illustration of a wall 240 of a removable vertical susceptor of plurality of removable vertical susceptors 130 of FIG. 1 in accordance with an example embodiment. In the example embodiment, the removable vertical susceptor will have four walls to form an enclosure. Alternatively, the removable vertical susceptor is not limited to four walls and can comprise three or more walls to form the enclosure. Wall 240 of the removable vertical susceptor comprises a heat spreader 205 configured to carry one or more silicon carbide wafers during the epitaxial growth process in Chemical Vapor Deposition (CVD) chamber 100 of FIG. 1. In general, each removable vertical susceptor of plurality of removable vertical susceptors 130 of FIG. 1 will have at least two walls as disclosed herein below. In the example embodiment, the at least two walls will face each other or be opposing walls. In the example embodiment, the at least two walls will each hold a single silicon carbide wafer. In the example embodiment, the at least two walls will be two walls. In the example embodiment, two other walls will couple to the at least two walls to form an enclosure of the removable vertical susceptor of plurality of removable vertical susceptors 130. In the example embodiment, the other two walls forming the enclosure can be heat shields or IR (infrared) reflectors. In one embodiment, heat spreader 205 comprises polycrystalline silicon carbide. Heat spreader 205 of the removable vertical susceptor includes a recessed region to form a wafer pocket 215. Wafer pocket 215 is configured to hold a silicon carbide wafer during a silicon carbide epitaxial deposition process. In one embodiment, polycrystalline silicon carbide is machined to form wafer pocket 215 to hold the silicon carbide wafer. In one embodiment, wafer pocket 215 is recessed having a circumferential edge that is configured to retain the silicon carbide wafer in place by gravity. In the example embodiment, heat spreader 205 comprising polycrystalline silicon carbide is used to spread heat coupled to it by a heater 220 that underlies the corresponding heat spreader 205. In one embodiment, a surface of heat spreader 205 that couples to the silicon carbide wafer is substantially uniform in temperature across the surface thereby leading to higher uniformity of thickness of epitaxially growth layers in silicon carbide wafers placed in wafer pocket 215. In one embodiment, the surface of heat spreader 205 is protected from mechanical damage, chemical reactions during operation, and handling by a protective layer 210. In one embodiment, the protective layer is configured to coat the interior and exterior of wall 240 including wafer pocket 215. In the example embodiment, protective layer 210 comprises a tantalum carbide coating overlying the polycrystalline silicon carbide of head spreader 205. The diameter of wafer pocket 215 is determined by the size of the silicon carbide wafers used for the epitaxial growth of silicon carbide in modular silicon carbide epitaxial reactor 195 of FIG. 1.

In one embodiment, heater 220 underlies heat spreader 205 on an exterior side of wall 240. Heater 220 is used to couple heat to heat spreader 205 through resistive heating. In the example embodiment, heater 220 comprises a serpentine resistive heater which is energized producing thermal heating via current flow produced by applying a voltage across the terminals of the serpentine resistive heater. In the example embodiment, heater 220 comprises a serpentine resistive heater formed by a single plate of graphite machined to form the serpentine shape. The length, width and number of folds of heater 220 along with the thickness of the graphite used for the machining of heater 220 is used for determining the resistance of heater 220 which is driven by application of AC or DC voltages. The resistance of heater 220 and applied voltage and current are used to operate heater 220 at the temperatures of (1500-1900° C.) that is typically required for epitaxial growth of silicon carbide. To protect heater 220 during operation and handling, a heater protective layer 225 is used to coat a surface of heater 220. In the example embodiment, heater protective layer 225 comprises tantalum carbide coated over heater 220 that comprises graphite. In the example embodiment, the serpentine shape of heater 220 comprising graphite enables very efficient resistive heating of heat spreader 205 comprising polycrystalline silicon carbide both in terms of power and time.

Heater 220 is isolated electrically from heat spreader 205 by using isolator 230 to prevent electrical shorting of heat spreader 205 by electrical current flowing in heater 220. In the one embodiment, isolator 230 used to provide electrical isolation comprises sapphire. Other embodiments can include materials that do not conduct electricity while maintaining material properties at temperatures greater than 1500 degrees centigrade. Isolator 230 may comprise rods, bars and other shapes to mechanically support heater 220 while providing electrical isolation to heat spreader 205. In one embodiment, isolator 230 can be configured to hold heater 220 to heat spreader 205.

In one embodiment, heater 220 is separated from heat spreader 205 by a gap 235. Gap 235 is the space between heat spreader 205 and heater 220. The spacing of gap 235 is used to ensure uniform heating of heat spreader 205 by the heat generated by heater 220. The heat generated by the resistive heating of heater 220 is radiated through gap 235 and couples to heat spreader 205 which transfers heat to the wafer placed on or in wafer pocket 215 in a manner to uniformly heat the silicon carbide wafer during the silicon carbide epitaxial growth. The spacing of gap 235 is determined by the design of heat spreader 205 and heater 220 and is in the range of (3-7) millimeters. In one embodiment, wafer pocket 215 has a sidewall 237. In one embodiment, sidewall 237 is configured to hold the silicon carbide wafer in place during the epitaxial growth process when tilted at an angle relative to the vertical. In one embodiment, heat spreader 205 is position between the process gases flowing interior to the removable vertical susceptor of removable vertical susceptors 130 and heater 220 thereby isolating heater 220 from being exposed to the process gases.

Figure 3:
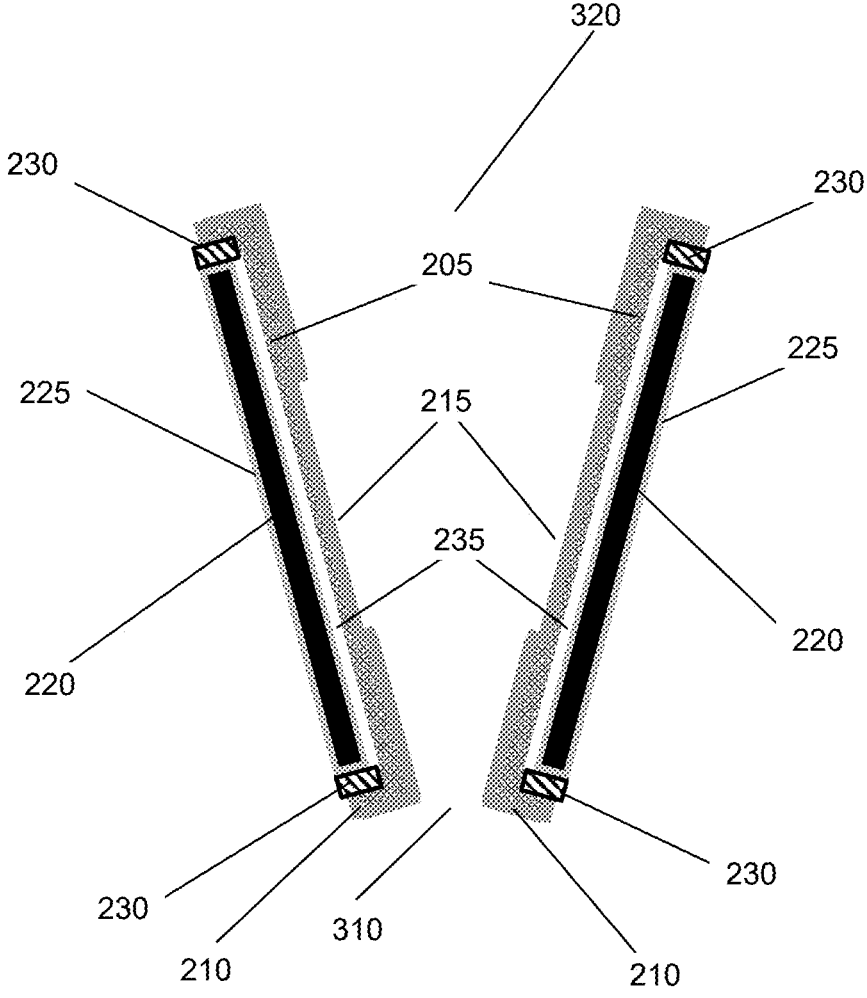
FIG. 3 is an illustration of a pair of walls of the removable vertical susceptor of the plurality of removable vertical susceptors in accordance with an example embodiment.

FIG. 3 is an illustration of a pair of walls of the removable vertical susceptor of plurality of removable vertical susceptors 130 of FIG. 2 in accordance with an example embodiment. Each wall 240 of the pair of walls in the removable vertical susceptor are tilted such that the bottoms of the pair of walls are closer than the tops of the pair of walls in order to enable more efficient operation of modular silicon carbide epitaxial reactor 195 of FIG. 1. In other words, a volume between the pair of walls has a taper that reduces the volume from a top of the vertical susceptor to a bottom of the vertical susceptor. In one embodiment, each wall 240 of the pair of walls form a part of the removable vertical susceptor of plurality of removable vertical susceptors 130. In one embodiment, each of the pair of walls of the removable vertical susceptor includes wafer pocket 215 to hold a silicon carbide wafer. The pair of walls as shown in the removable vertical susceptor, are facing each other and are tilted to the vertical such that the gap 310 at the bottom of a pair of walls in each removable vertical susceptor is smaller than the top gap 320 at the top of each pair of walls in the removable vertical susceptor. Top gap 320 at the top of each pair of walls facing each other in the removable vertical susceptor is coupled to corresponding output of inlet heat exchanger 120 of FIG. 1 and gap 310 at the bottom of the pair of walls in the removable vertical susceptor is coupled to an input of the plurality of inputs of exhaust heat exchanger 140 in FIG. 1. The angle of tilt of each wall 240 of the removable vertical susceptor determines the dimension of top gap 320 and gap 310 at the top and bottom of a pair of walls of the removable vertical susceptor of plurality of removable vertical susceptors 130. Gap 310 at the bottom of a pair of walls of the removable vertical susceptor enables the reduction of the boundary layer of process gases 110 of FIG. 1 to enable more uniform deposition rate of modular silicon carbide epitaxial reactor 195 of FIG. 1 as explained in more detail in FIGS. 4-7. In one embodiment, each removable vertical susceptor of plurality of removable vertical susceptors 130 of FIG. 1 has at least the pair of walls as disclosed herein above.

Figure 4:
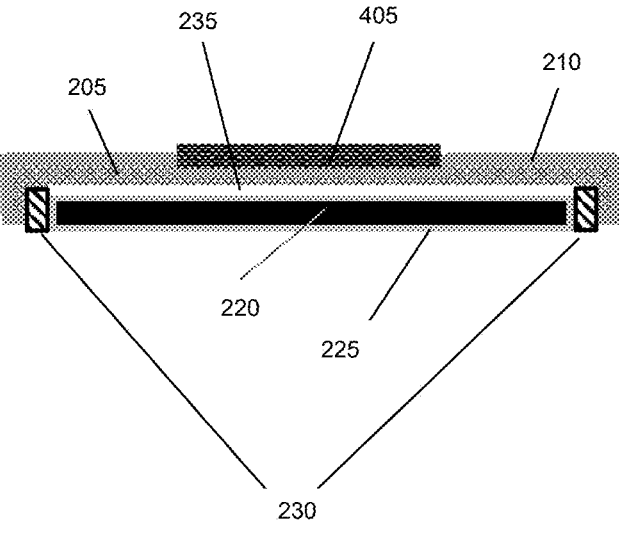
FIG. 4 is an illustration of the wall of the vertical susceptor of the plurality of removable vertical susceptors with a silicon carbide wafer placed in the wafer pocket in accordance with an example embodiment.

FIG. 4 is an illustration of wall 240 of the pair of walls of the removable vertical susceptor of plurality of removable vertical susceptors 130 of FIG. 3 with a silicon carbide wafer 405 placed in wafer pocket 215 as shown in accordance with an example embodiment. Silicon carbide wafer 405 placed in wafer pocket 215 of wall 240 of each removable vertical susceptor of plurality of removable vertical susceptors 130 of FIG. 1 is used for the epitaxial growth of silicon carbide layers that is subsequently used for fabrication of silicon carbide devices and circuits using methods and processes well known to those skilled in the art. In one embodiment, silicon carbide wafer 405 placed in wafer pocket 215 is substantially planar with the surface of heat spreader 205 coated with protective layer 210.

Figure 5:
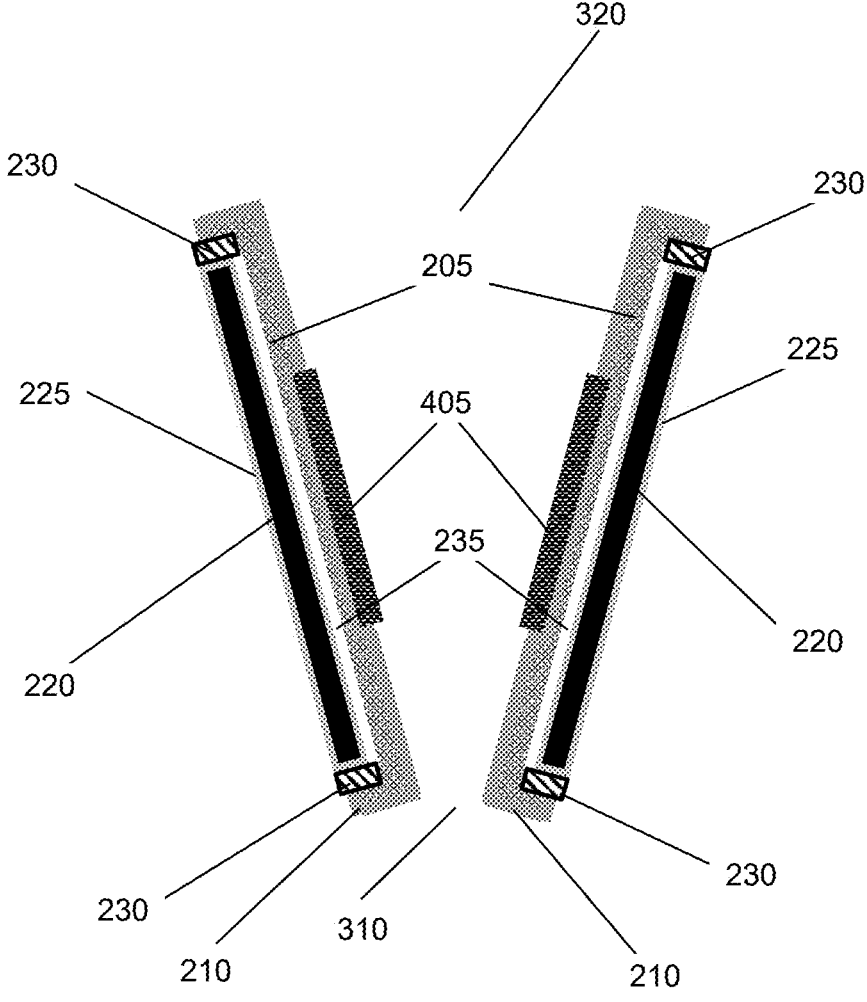
FIG. 5 is an illustration of the pair of walls each carrying a silicon carbide wafer in accordance with an example embodiment.

FIG. 5 is an illustration of the pair of walls of FIG. 3 each carrying a silicon carbide wafer 405 in accordance with an example embodiment. In the example embodiment, the pair of walls are from the removable vertical susceptor of plurality of removable vertical susceptors 130 as disclosed herein above. In one embodiment, each removable vertical susceptor of the plurality of removable vertical susceptors 130 of FIG. 1 has the pair of walls for holding silicon carbide wafers for batch processing in growing a silicon carbide epitaxial layer thereon. Silicon carbide wafers 405 placed in wafer pockets 215 of the pair of walls of the removable vertical susceptor are held in placed by the force of gravity because of the tilt of the pair of walls relative to the vertical. In one embodiment, silicon carbide wafers 405 placed in wafer pockets 215 of the pair of walls face each other during the epitaxial growth of one or more silicon carbide epitaxial layers during the epitaxial growth process in modular silicon carbide epitaxial reactor 195 of FIG. 1.

Figure 6:
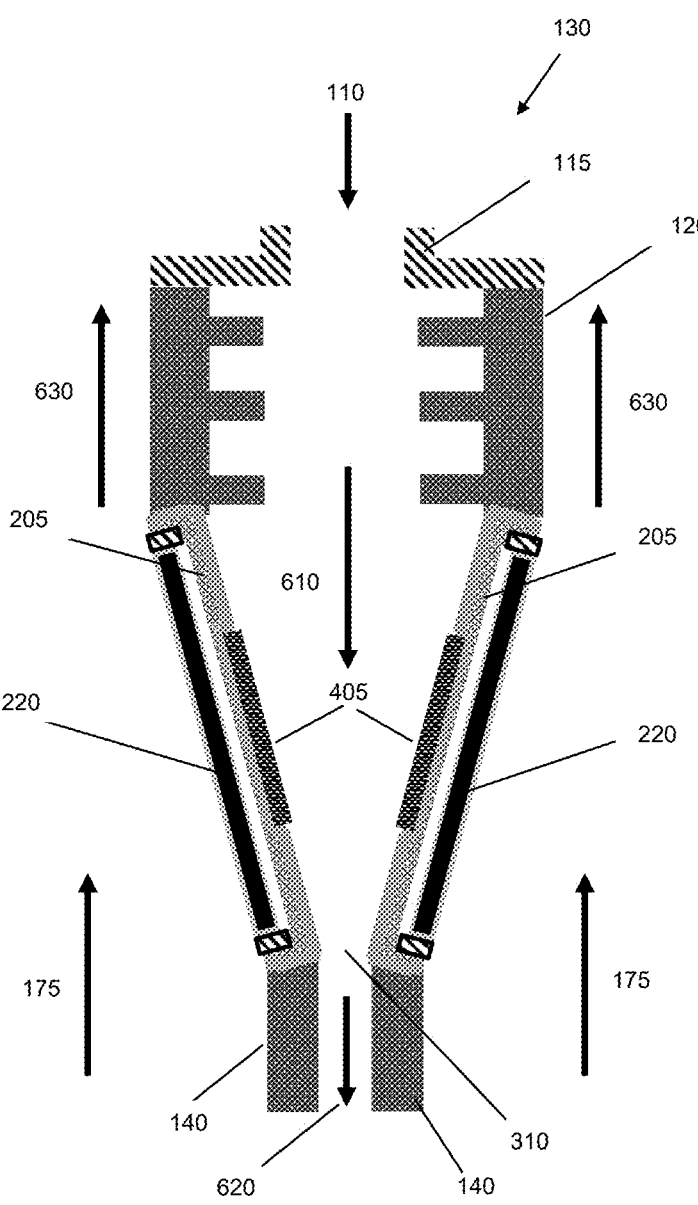
FIG. 6 is an illustration of the removable vertical susceptor showing further operational detail in accordance with an example embodiment.

FIG. 6 is an illustration of the removable vertical susceptor of FIG. 5 showing further operational detail in accordance with an example embodiment. The removable vertical susceptor is shown coupled to components of modular SiC epitaxial reactor 195 of FIG. 1. As shown, process gases 110 will support epitaxial growth of one or more silicon carbide layers on silicon carbide wafers 405 coupled to the pair of walls of the removable vertical susceptor within modular silicon carbide reactor 195 of FIG. 1. The removable vertical susceptor illustrates the operation of the epitaxial growth process within modular silicon carbide epitaxial reactor 195 of FIG. 1 using detailed descriptions also referenced by FIGS. 1-7. In one embodiment, the removable vertical susceptor is one of plurality of removable vertical susceptors 130 of FIG. 1 and the removable vertical susceptor used to describe operation of modular silicon carbide epitaxial reactor 195 from FIG. 1. In one embodiment, each removable vertical susceptor with plurality of removable vertical susceptors 130 will be operating substantially equally. Process gases 110 flow in inlet gas manifold 105 and exit through an output of the plurality of outputs 115 coupled to an inlet heat exchanger of the plurality of inlet heat exchangers 120. Process gases 110 flowing through the inlet heat exchanger of the plurality of heat exchangers 120 are heated by the gas exchange process to a predetermined temperature to facilitate more efficient operation of modular SiC epitaxial reactor 195 of FIG. 1. The preheating of process gases 110 leads to heated process gases 610 that flows into the removable vertical susceptor of the plurality of removable vertical susceptors 130. In the example embodiment, heated process gases 610 in the removable vertical susceptor comprises TCS, propane, and hydrogen gas while optionally flowing nitrogen and TriMethyl Aluminum for doping.

Heated process gases 610 enter the removable vertical susceptor of plurality of removable vertical susceptors 130. The removable vertical susceptor comprises the pair of walls that face each other. It should be noted that the removable vertical susceptor forms an enclosure and will have other walls to complete the enclosure but the other walls may not hold silicon carbide wafers. Each wall 240 of the pair of walls comprise heat spreader 205 with heater 220, wafer pocket 215, and has silicon carbide wafer 405. The pair of walls are tilted to the vertical such that top gap 320 is wider than gap 310 at the bottom of the removable vertical susceptor. The tilt of the pair of walls enables each silicon carbide wafer 405 placed in each wafer pocket 215 to be held by gravity in the pair of walls. In an example embodiment, heat spreader 205 comprises polycrystalline silicon carbide and heater 220 comprises a resistive heater machined of graphite. Electrical energy applied to heater 220 generates resistive heat that is transferred to heat spreader 205 and thereby to silicon carbide wafer 405. Due to the thermal energy coupled by heater 220, heat spreader 205 and silicon carbide wafer 405 further experience an increase in temperature of heated process gases 610 to initiate the epitaxial growth on surface of silicon carbide wafer 405 and leads to CVD growth of silicon carbide on surface of silicon carbide wafer 405 at temperatures of (1500-1900° C.) Since the temperature of heated process gases 610 is already elevated by the preheating in inlet heat exchanger 120, the energy required to reach the reaction temperature of the epitaxial growth process is reduced leading to more efficient operation of modular silicon carbide epitaxial reactor 195 of FIG. 1. The detailed design of each wall 240 is described in FIGS. 2-5. Heat spreader 205 comprising wafer pocket 215 with silicon carbide wafer 405 placed in wafer pocket 215 comprises a hot zone since the heat from heater 220 is coupled to heat spreader 205 and increased to temperatures between (1500-1900° C.) for supporting epitaxial growth of silicon carbide on silicon carbide wafer 405. Using this configuration, the temperature variation across the surface of silicon carbide wafer 405 is between (±10° C.).

In the example embodiment, gap 310 in the removable vertical susceptor is configured to compensate for the depletion of heated process gases 610 by reducing the thickness of the boundary layer coupling to the surface of each wall 240 thereby producing a layer of epitaxially grown silicon carbide on the surface of silicon carbide wafer 405 held in wafer pocket 215. In the example embodiment, the flow of heated process gases 610 is vertically downward and funnels through top gap 320 to gap 310 tapered by the tilt of the pair of walls to the vertical to reduce the thickness of the boundary layer leading to more uniform thickness of grown epitaxial layer.

In the example embodiment, the removable vertical susceptor couples to the input of an exhaust heat exchanger of the plurality of exhaust heat exchangers 140. The heat from heated process gases 610 through gap 310 to the exhaust heat exchanger is reclaimed to ensure more efficient thermal operation of modular silicon carbide epitaxial reactor 195 of FIG. 1. After exchanging heat from plurality of removable vertical susceptors 130 to plurality of exhaust heat exchangers 140, unreacted gases and any particulates of heated process gases 610 are removed by exhausting heated process gases 610 through output gas manifold 145 of FIG. 1. In one embodiment, the unreacted gases and particulates are treated or recirculated using a scrubber and output as unreacted process gases 150 of FIG. 1.

In the example embodiment, incoming hydrogen gas 160 is provided through inlet port 155 of CVD chamber 100 of FIG. 1 and is distributed between each removable vertical susceptor of the plurality of removable vertical susceptors 130 as hydrogen gas 175. Hydrogen gas 175 flows around external surfaces of the exhaust heat exchanger of the removable vertical susceptor. The exhaust heat exchanger transfers heat from heated process gases 610 and heats hydrogen gas 175 flowing in an opposite direction external to the removable vertical susceptor. In general, each exhaust heat exchanger of plurality of exhaust heat exchangers 140 is heating hydrogen gas 175 within CVD chamber 100 of FIG. 1. The heated hydrogen gas 175 flows around the external surface of the removable vertical susceptor of plurality of removable vertical susceptors 130 and the inlet heat exchanger of the plurality of inlet heat exchangers 120. The heat carried by heated hydrogen gas 175 is coupled to inlet heat exchanger 120 and used to heat process gases 110 to a predetermined temperature as described above. After the heat exchange, cooled hydrogen gas 175 is evacuated through outlet port 165 of CVD chamber 100 of FIG. 1 to be treated or recirculated.

In the example embodiment, the counter flow of gases is such that process gases 110 flows vertically downward through inlet heat exchanger 120, the vertical susceptor of plurality of removable vertical susceptors 130, and the exhaust heat exchanger of plurality of exhaust heat exchangers 140 while hydrogen gases used for the heat transfer flow vertically upwards outside the surfaces of the exhaust heat exchanger of plurality of exhaust heat exchangers 140, the vertical susceptor of a plurality of removable vertical susceptors 130, and inlet heat exchanger 120. The counter flow of process gases 110 and hydrogen gas 175 supports the use of less electrical energy thereby reducing the electricity used to drive heaters 220 using resistive heating. In general, the process of heat exchanging by counter flow gases greatly reduces the cost in batch mode silicon carbide epitaxial growth when the epitaxial growth process operates at temperatures greater than 1000 degrees centigrade.

The gas flow comprising process gases 110 through inlet heat exchanger 120, the removable vertical susceptor of plurality of removable vertical susceptors 130, the exhaust heat exchanger of the plurality of exhaust heat exchangers 140, and output gas manifold 145 of FIG. 1 is kept substantially isolated from hydrogen gas 175 flowing outside the components listed herein above by using a higher pressure for hydrogen gas 175 than for process gases 110 flowing in inlet heat exchanger 120, the removable vertical susceptor of plurality of removable vertical susceptors 130, the exhaust heat exchanger of the plurality of exhaust heat exchangers 140, and output gas manifold 145 of FIG. 1 such that the pressure differential isolates process gases 110 inside from hydrogen gas flowing outside. In the example, each removable vertical susceptor of the plurality of removable vertical susceptors 130 of FIG. 1 operates equivalently using the counterflow gases for more efficient processing and equal epitaxial growth on all silicon carbide wafers in batch mode processing. In the example embodiment, hydrogen gas 175 can be independently controlled to achieve the best temperature uniformity across silicon carbide wafer 405 and also to achieve a low exhaust temperature of process gases 110. Hydrogen gas 175 can be in a completely closed loop system such that that it recycled and reused to enable efficient heat exchange with process gases 110. Other inert gases can be used in place of hydrogen gas 175 that have a low specific heat such as helium.

Figure 7:
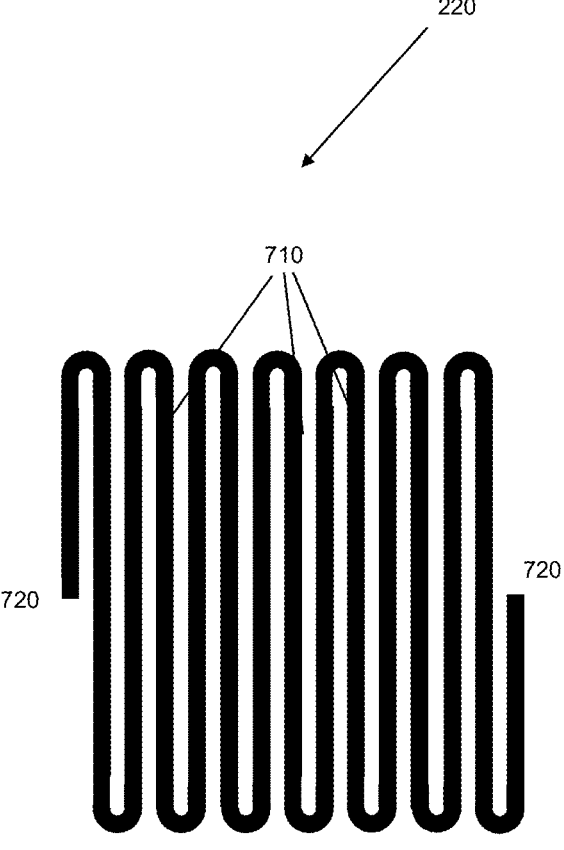
FIG. 7 is an illustration of a heater element of the heater of the removable vertical susceptor of FIG. 6 in accordance with an example embodiment.

FIG. 7 is an illustration of a heater element of heater 220 shown in FIG. 6 of the removable vertical susceptor in accordance with an example embodiment. In the example embodiment, the heater element of heater 220 comprises serpentine folds 710 of graphite machined to form the heating element. The number of serpentine folds 710 is dependent on the design of heater 220 for providing the necessary thermal energy to achieve the requisite temperature range of (1500-1900° C.) for epitaxial growth of silicon carbide on silicon carbide wafers 405 as shown in FIG. 6. In one embodiment, the heater element of each heater 220 in plurality of removable vertical susceptors 130 are equal or identical. In heater 220, end connectors 720 are used to couple to the electrical power source such that the current flowing through serpentine folds 710 raises the heater temperature to between (1500-1900° C.) To protect heater 220 during operation and handling, heater protective layer 225 is used to coat the surface of heater 220. In the example embodiment, heater protective layer 225 comprises tantalum carbide coated over heater 220 comprising graphite.

Figure 8:
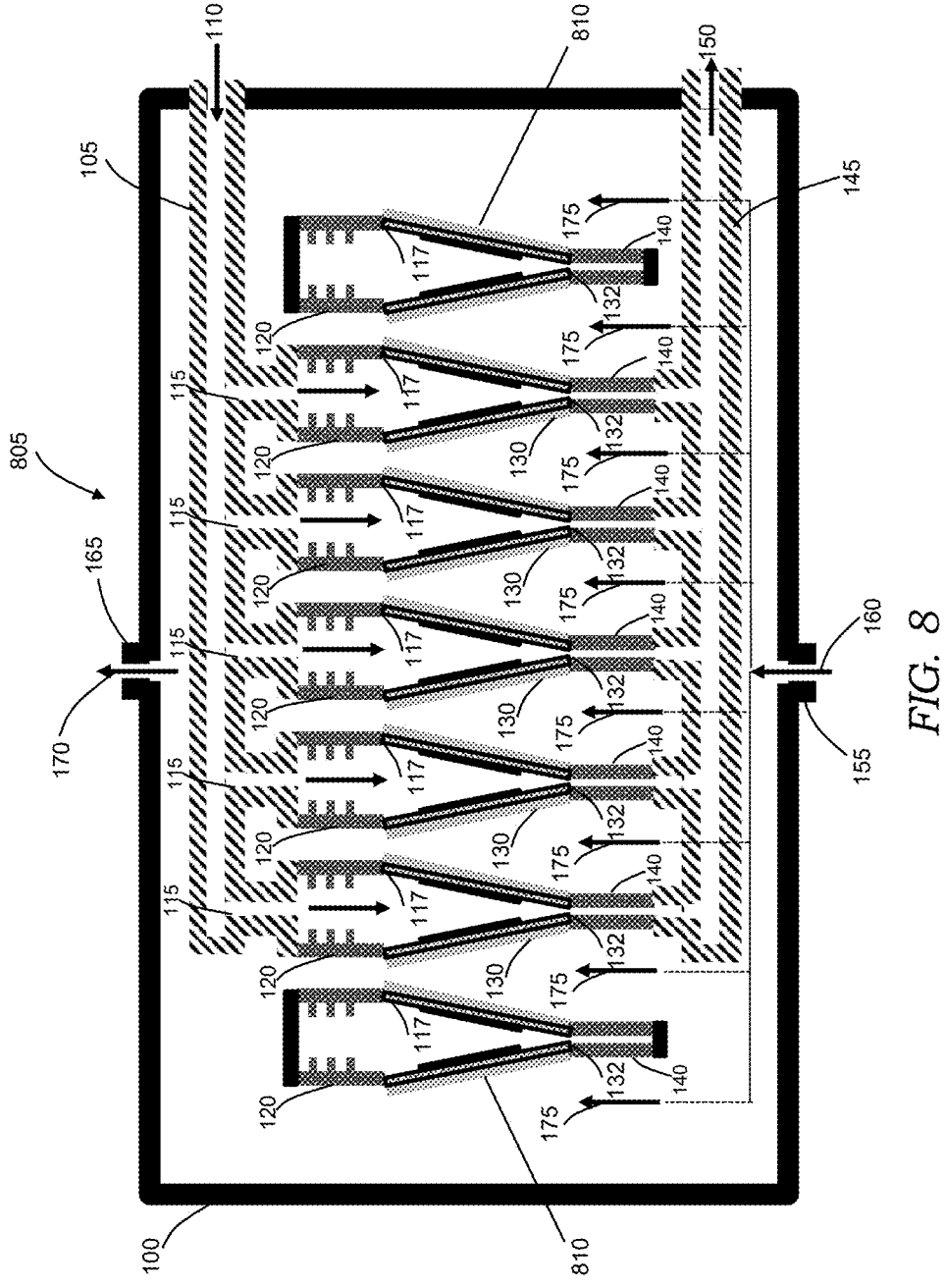
FIG. 8 is an illustration of an alternate embodiment of a modular silicon carbide epitaxial reactor in accordance with an example embodiment.

FIG. 8 is an illustration of an alternate embodiment of a modular silicon carbide epitaxial reactor 805 in accordance with an example embodiment. In the example embodiment, five removable vertical susceptors comprise plurality of removable vertical susceptors 130. The five removable vertical susceptors are in a row and spaced identically. In general, the number of removable vertical susceptors in plurality of removable vertical susceptors 130 is three or greater. In one embodiment, dummy vertical susceptors 810 are placed adjacent to walls of CVD chamber 100 and on either end of the row of the five removable vertical susceptors. In one embodiment, heaters can be used to replace dummy vertical susceptors 810. In one embodiment, the heaters are fixed in placed inside modular silicon carbide epitaxial reactor 805. The heaters are effectively isolated from the process gases flowing through plurality of removable vertical susceptors 130. In general, dummy vertical susceptors 810 or the heaters are used to independently compensate for heat loss to form the outermost modules in the modular silicon carbide epitaxial reactor 805 such that each removable vertical susceptor of plurality of removable vertical susceptors 130 is thermally identical in operation to ensure uniformity of epitaxial growth in each removable vertical susceptor of plurality of removable vertical susceptors 130. Heat reflectors and IR (Infrared) shields may also be additionally utilized to improve the thermal uniformity during the epitaxial growth process. Dummy vertical susceptors 810 are similar in design of plurality of removable vertical susceptors 130 except they are not coupled to inlet gas manifold 105 and output gas manifold 145. The inlet heat exchanger and exhaust heat exchanger of each dummy vertical susceptor 810 are capped such that there is no flow of process gases 110 internal to surfaces of dummy vertical susceptor 810. Inlet gas manifold 105 is coupled to inlet heat exchanger 120 and each output of plurality of outputs 117 from inlet heat exchanger 120 is coupled to plurality of removable vertical susceptors 130 such that process gases 110 flow over walls of each removable vertical susceptor of plurality of removable vertical susceptors 130. The operation of plurality of removable vertical susceptors 130 for epitaxial growth of silicon carbide is described in detail in FIGS. 2-7 herein above. Plurality of removable vertical susceptors 130 are coupled to plurality of exhaust heat exchangers 140 which are coupled to output gas manifold 145. Hydrogen gas 160 flowing through inlet port 155 carries heat from plurality of exhaust heat exchangers 140 to preheat process gases 110 flowing through inlet heat exchanger 120 to a predetermined temperature to improve the energy efficiency of modular silicon carbide epitaxial reactor 805. After the heat exchange between inlet heat exchanger 120 and hydrogen gas 175, cooled hydrogen gas 170 exits CVD chamber 100 through outlet port 165 for treatment or recirculation. In dummy vertical susceptors 810, the heaters in each dummy susceptor are heated to process temperatures required for epitaxial growth of silicon carbide of (1500-1900)° C. but there is no flow of process gases 110. Thus, in dummy vertical susceptors 810, there is no epitaxial deposition.

Dummy vertical susceptors 810 or the heaters are placed adjacent to walls of CVD chamber 100 and plurality of removable vertical susceptors 130 provide a fixed and repeatable thermal mass for the uniform heating and heat transfer between hydrogen gas 175 and inlet heat exchanger 120 leading to better deposition uniformity of epitaxially grown silicon carbide in silicon carbide wafers 405 placed in plurality of removable vertical susceptor 130. Dummy vertical susceptors 810 or the heaters provides a heat shielding function for plurality of removable vertical susceptors 130 leading to better thermal performance and better deposition uniformity of silicon carbide in modular silicon carbide epitaxial reactor 805. In one embodiment, dummy vertical susceptors 810 or the heaters provide symmetry of operation to the two outermost removable vertical susceptors in the row of five removable vertical susceptors. The concept of dummy vertical susceptors or the heaters can be extended to a two dimensional array of plurality of removable vertical susceptors 130 should modular silicon carbide epitaxial reactor 805 include columns of removable vertical susceptors.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-8. In one embodiment, modular silicon carbide epitaxial reactor 195 comprises inlet gas manifold 105 having plurality of outputs 115 configured for delivering process gases 110, inlet heat exchanger 120 having plurality of inputs and plurality of outputs 117 where the plurality of inputs of the inlet heat exchanger 120 couple to the plurality of outputs 115 of inlet gas manifold 105 and where inlet heat exchanger 120 is configured to heat process gases 110.

Modular silicon carbide epitaxial reactor 195 further comprises plurality of removable vertical susceptors 130 having a plurality of inputs and a plurality of outputs 132, where the plurality of inputs of the plurality of removable vertical susceptors 130 couples to plurality of outputs 117 of inlet heat exchanger 120, where each removable vertical susceptor 130 is configured to hold at least two SiC wafers 405 for batch mode epitaxial growth, and where a surface of each SiC wafer 405 is configured to be tilted relative to the vertical to compensate for depletion of reactants as process gases 110 flow over a surface of each SiC wafer 405 to support substantially even epitaxial growth across the surface of SiC wafer 405.

Modular silicon carbide epitaxial reactor 195 further comprises plurality of exhaust heat exchangers 140 having a plurality of inputs and plurality of outputs, where the plurality of inputs of plurality of exhaust heat exchangers 140 couple to plurality of outputs 132 of plurality of removable vertical susceptors 130, where plurality of exhaust heat exchangers 140 are configured to heat hydrogen gas 175 (H2), and where heated hydrogen gas 175 is configured to couple the heat to inlet heat exchanger 120 thereby reducing energy consumption of modular SiC epitaxial reactor 195.

Modular silicon carbide epitaxial reactor 195 further comprises a scrubber coupled to the outputs of the plurality of exhaust heat exchangers 140 where the scrubber is configured to remove particulates or unreacted process gases received from the plurality of outputs of plurality of exhaust heat exchangers 140.

In one embodiment, process gases 110 are configured for laminar flow over the surface of each SiC wafer 405 to support compensation of the depletion of reactants as process gases 110 flow over the surface of each SiC wafer 405 and to carry particulates from settling on each SiC wafer 405 in each of removable vertical susceptors 130 of plurality of removable vertical susceptors 130 such that the particulates are carried to the scrubber thereby reducing defectivity within modular silicon carbide epitaxial reactor 195.

Hydrogen gas flows within modular silicon carbide epitaxial reactor 195 such that a pressure of hydrogen gas 175 is configured to be greater than a pressure of process gases 110 within the plurality of removable vertical susceptors 130.

In one embodiment, the plurality of inputs of plurality of removable vertical susceptors 130 is configured to be sealed to plurality of outputs 117 of inlet heat exchanger 120 and where plurality of outputs 132 of plurality of removable vertical susceptors 130 is configured to be sealed to the plurality of inputs of plurality of exhaust heat exchangers 140 within modular silicon carbide epitaxial reactor 195. In one embodiment, the sealing is configured to support removal of plurality of removable vertical susceptors 130.

In one embodiment, modular silicon carbide epitaxial reactor 195 includes hydrogen gas (H2) 175 configured to flow in an opposite direction as process gases 110 provided by inlet heat exchanger 120, where hydrogen gas 175 is configured to flow outside each of plurality of removable vertical susceptors 130, and where hydrogen gas 175 is recirculated in modular Silicon Carbide (SiC) epitaxial reactor 195.

In one embodiment, modular silicon carbide epitaxial reactor 195 includes at least two heat shields 180 placed in modular SiC epitaxial reactor 195 to support maintaining each removable vertical susceptor of plurality of removable vertical susceptor 130 at substantially identical conditions.

In one embodiment, each removable vertical susceptor of plurality of removable vertical susceptors 130 comprises a plurality of walls to form an enclosure, where each removable vertical susceptor has a plurality of walls 240, where the at least two of the walls of plurality of walls 240 in each removable vertical susceptor are tilted within an angle range of (2-20) degrees relative to the flow of the gases within modular Silicon Carbide (SiC) epitaxial reactor 195. In one embodiment, each removable vertical susceptor of the plurality of removable vertical susceptors 130 is configured having at least two walls that include wafer pocket 215, where each wafer pocket 215 of the at least two walls is configured to hold a SiC wafer 405, and where each wafer pocket 215 is configured to hold the SiC wafer by gravity.

In one embodiment, each removable vertical susceptor of plurality of removable vertical susceptors 130 includes heater 220 underlying each of the at least two walls of plurality of walls 240. The at least two walls of the plurality of walls 240 has a wafer pocket 215 configured for holding a silicon carbide wafer 405.

In one embodiment, each removable vertical susceptor of plurality of removable vertical susceptors 130 includes at least two walls of plurality of walls 240 have wafer pocket 215 that are configured to face each other.

In one embodiment, modular Silicon Carbide (SiC) epitaxial reactor 195 comprises at least two walls having wafer pocket 215 forming the enclosure of each removable vertical susceptor of plurality of removable vertical susceptors 130. The at least two walls of plurality of walls 240 are configured as heat spreaders 205 for substantially uniform heating of SiC wafer 405 held in wafer pocket 215.

In one embodiment, modular Silicon Carbide (SiC) epitaxial reactor 195 includes heaters 220 where each heater 220 is a serpentine resistive heater and where each heater 220 comprises graphite. In one embodiment, heaters 220 couple to the at least two walls having wafer pocket 215 in each removable vertical susceptor of plurality of removable vertical susceptors within modular SiC epitaxaial reactor 195.

In one embodiment, modular Silicon Carbide (SiC) epitaxial reactor 195 includes heaters 220 where each heater 220 is coated with Tantalum Carbide (TaC) and where plurality of walls 240 of each removable vertical susceptor of plurality of removable vertical susceptors 130 is coated with Tantalum Carbide (TaC).

In one embodiment, modular Silicon Carbide (SiC) epitaxial reactor 195 is configured wherein each heater 220 underlying the at least two walls having wafer pocket 215 of plurality of walls 240 of each removable vertical susceptor of plurality of removable vertical susceptors 130 is separated by gap 235.

In one embodiment, modular Silicon Carbide (SiC) epitaxial reactor 195 is configured such that each removable vertical susceptor of plurality of removable vertical susceptors 130 is configured to be removed from modular SiC epitaxial reactor 195, where heaters 220 can be removed from the at least two walls of plurality of walls 240 of each removable vertical susceptor of plurality of removable vertical susceptors 130 for cleaning, wherein the plurality of walls 240 of each removable vertical susceptor of plurality of removable vertical susceptors 130 are configured to be cleaned thereby removing buildup of polycrystalline SiC.

In one embodiment, modular Silicon Carbide (SIC) epitaxial reactor 195 is configured such that process gases 110 have a velocity with a range of (5-150) SLM (Standard Litres per Minute) within each removable vertical susceptor of plurality of removable vertical susceptors 130.

In one embodiment, modular Silicon Carbide (SiC) epitaxial reactor 195 is configured having the temperature uniformity within a hot zone is within a range of (±10° C.) within each removable vertical susceptor of plurality of removable vertical susceptors 130.

In one embodiment, modular Silicon Carbide (SiC) epitaxial reactor 195 is configured to grow an epitaxial layer on six or more SiC wafers 405 simultaneously, where each of the six or more SiC wafers 405 are held at an angle less than 45 degrees relative to vertical of modular SiC epitaxial reactor 195, where each of the six or more SiC wafers 405 is configured to couple to heat spreader 205, where each heat spreader 205 includes a resistive heater 220, and where each resistive heater 220 is isolated from process gases 110.

In one embodiment, modular Silicon Carbide (SiC) epitaxial reactor 195 includes inlet gas manifold 105 configured for receiving gases configured for growing SiC epitaxial layers on SiC wafers 405 in batch mode.

In one embodiment, modular Silicon Carbide (SIC) epitaxial reactor 195 includes inlet heat exchanger 120 coupled to inlet gas manifold 105 where inlet heat exchanger 120 is configured to provide process gases 110 heated to a predetermined temperature of at least 1000° C.

In one embodiment, modular Silicon Carbide (SiC) epitaxial reactor 195 comprises at least three removable vertical susceptors where each of the at least 3 removable vertical susceptors are coupled to inlet heat exchanger 120 and is configured for flowing process gases 110 downward and vertical, where each of the at least three removable vertical susceptors is configured to hold at least two SiC wafers 405 for batch mode epitaxial growth, and where a surface of each SiC wafer 405 is configured to be tilted from vertical to compensate for depletion of reactants as the heated gases flow over the surface of each SiC wafer 405 to support substantially even epitaxial growth across the surface of each SiC wafer 405.

In one embodiment, modular Silicon Carbide (SiC) epitaxial reactor 195 comprises at least two heat shields 180 in modular SiC epitaxial reactor 195 configured to support substantially equal operation of the at least three removable vertical susceptors. Plurality of exhaust heat exchangers 140 are configured to couple to the at least three removable vertical susceptors where plurality of exhaust heat exchangers 140 receive unreacted process gases from the at least three removable vertical susceptors, where plurality of exhaust heat exchangers 140 are configured to transfer heat from the unreacted process gasses to hydrogen gas ($H_2$) 175, where hydrogen gas 175 flows in an opposite direction as process gases 110 within the at least three removable vertical susceptors, and where hydrogen gas 175 is configured to transfer heat to inlet heat exchanger 120.

What is claimed:
1. A modular Silicon Carbide (SiC) epitaxial reactor comprising:
   an inlet gas manifold having an input for receiving process gases and a plurality of outputs;
   plurality of inlet heat exchangers having a plurality of inputs coupled to the plurality of outputs of the inlet gas manifold and a plurality of outputs for providing heated process gases;
   a plurality of removable vertical susceptors having a plurality of inputs coupled to the plurality of outputs of the plurality of inlet heat exchangers and a plurality of outputs that output unreacted process gases, wherein each removable vertical susceptor has at least two wafer pockets for heating and holding SiC wafers at an angle less than 45 degrees relative to vertical for batch mode epitaxial growth to compensate for depletion of reactants and support substantially even epitaxial growth;

a plurality of exhaust heat exchangers having a plurality of inputs coupled to the plurality of outputs of the plurality of removable vertical susceptors and a plurality of outputs that provide the unreacted process gases at a reduced temperature;

an output gas manifold having a plurality of inputs coupled to the plurality of outputs of the plurality of exhaust heat exchangers and an output for exiting unreacted process gases; and a chamber for housing the inlet gas manifold, the plurality of inlet heat exchangers, the plurality of removable vertical susceptors, the plurality of exhaust heat exchangers, and the output gas manifold, wherein an inert gas such as hydrogen ($H_2$) or helium has a gas path from an input of the chamber through the plurality of exhaust heat exchangers to transfer heat from the unreacted process gases to the inert gas, the inert gas at a higher temperature then passes through the plurality of inlet heat exchangers to transfer heat from the inert gas to the process gases, and the inert gas at a lower temperature then exits the output of the chamber.

2. The modular Silicon Carbide (SiC) epitaxial reactor of claim 1 further including a scrubber having a plurality of inputs coupled to the outputs of the plurality of exhaust heat exchangers and a plurality of outputs coupled to the plurality of inputs of the output gas manifold wherein the scrubber is configured to remove particulates or unreacted process gases received from the plurality of outputs of the plurality of exhaust heat exchangers.

3. The modular Silicon Carbide (SiC) epitaxial reactor of claim 2 wherein the process gases have laminar flow over the surface of each SiC wafer in each removeable vertical susceptor of the plurality of removeable vertical susceptors to support compensation of the depletion of reactants and to carry particulates from settling on each SiC wafer in each of the removable vertical susceptors of the plurality of removable vertical susceptors such that the particulates are carried to the scrubber thereby reducing defectivity.

4. The modular Silicon Carbide (SiC) epitaxial reactor of claim 1 wherein a pressure of the inert gas in the chamber is greater than a pressure of the process gases within the plurality of removable vertical susceptors.

5. The modular Silicon Carbide (SiC) epitaxial reactor of claim 4 wherein the plurality of inputs of the plurality of removable vertical susceptors are sealed to the plurality of outputs of the inlet heat exchanger and wherein the plurality of outputs of the plurality of removable vertical susceptors are sealed to the plurality of inputs of the plurality of exhaust heat exchangers.

6. The modular Silicon Carbide (SiC) epitaxial reactor of claim 1 wherein the inert gas is configured to flow in an opposite direction through the chamber as the process gases provided by the inlet heat exchanger through the plurality of removeable vertical susceptors.

7. The modular Silicon Carbide (SiC) epitaxial reactor of claim 1 further including at least two heat shields placed in the modular SiC epitaxial reactor to support maintaining each removable vertical susceptor of the plurality of removable vertical susceptor at substantially identical conditions.

8. The modular Silicon Carbide (SiC) epitaxial reactor of claim 1 wherein each removable vertical susceptor of the plurality of removable vertical susceptors comprises a plurality of walls and wherein the at least two wafer pockets in each removeable vertical susceptor are formed in polycrystalline silicon carbide substrate and are tilted within an angle range of (2-20) degrees relative to the flow of the process gases.

9. The modular Silicon Carbide (SiC) epitaxial reactor of claim 8 wherein a heater underlies the at least two wafer pockets in each removeable vertical susceptor.

10. The modular Silicon Carbide (SiC) epitaxial reactor of claim 9 wherein each of the polycrystalline silicon carbide substrates in each removeable vertical susceptor is a heat spreader.

11. The modular Silicon Carbide (SiC) epitaxial reactor of claim 9 wherein the at least two walls of the plurality of walls of each removable vertical susceptor face each other.

12. The modular Silicon Carbide (SiC epitaxial reactor of claim 9 wherein the at least two wafer pockets in each removeable vertical susceptor includes a protective outer layer to resist chemical reaction or mechanical damage.

13. The modular Silicon Carbide (SiC) epitaxial reactor of claim 9 wherein each heater underlying the at least two wafer pockets in each removeable vertical susceptor is a serpentine resistive heater and wherein each heater comprises graphite.

14. The modular Silicon Carbide (SiC) epitaxial reactor of claim 9 wherein each heater underlying the at least two wafer pockets in each removeable vertical susceptor is coated with Tantalum Carbide (TaC) and wherein the plurality of walls of each removable vertical susceptor of the plurality of removable vertical susceptors is coated with Tantalum Carbide (TaC).

15. The modular Silicon Carbide (SiC) epitaxial reactor of claim 10 wherein the heaters in each removeable vertical susceptor can be removed for cleaning.

16. The modular Silicon Carbide (SiC) epitaxial reactor of claim 10 wherein each removable vertical susceptor of the plurality of removable vertical susceptors can be removed from the modular SiC epitaxial reactor.

17. The modular Silicon Carbide (SiC) epitaxial reactor of claim 1 wherein the process gases have a velocity with a range of 5 SLM (standard liters per minute) to 150 SLM.

18. The modular Silicon Carbide (SiC) epitaxial reactor of claim 1 wherein the temperature uniformity within a hot zone is within a range of ±10° C.

19. A modular Silicon Carbide (SiC) epitaxial reactor comprising:

at least one inlet heat exchanger having an input for receiving process gases and an output for providing heated process gases;

at least one removeable vertical susceptor having an input coupled to the output of the at least one inlet heat exchanger and an output for providing unreacted process gases, wherein the at least one removeable vertical susceptor includes at least two wafer pockets each at an angle less than 45 degrees relative to vertical for holding a silicon carbide wafer;

at least one exhaust heat exchanger having an input coupled to the output of the at least one removeable vertical susceptor and an output, wherein unreacted process gases at the output of the at least one exhaust heat exchanger have a lower temperature than at the input of the at least one exhaust heat exchanger; and a chamber housing the at least one inlet heat exchanger, the at least one removeable vertical susceptor, and the at least one exhaust heat exchanger, wherein the chamber has an input and an output, wherein an inert gas is provided at the input of the chamber, wherein the inert gas flows in an opposite direction of the process gases, and wherein an inert gas path flows from the input of the chamber through the at least one exhaust heat exchanger to transfer heat from the unreacted process gases to the inert gas, the heated inert gas then flows through the at least one inlet heat exchanger to transfer heat from the inert gas to the process gases, and the inert gas then exits the output of the chamber to be recirculated to the input of the chamber.

20. A modular Silicon Carbide (SiC) epitaxial reactor comprising:

an inlet gas manifold having an input for receiving process gases and a plurality of outputs;

plurality of inlet heat exchangers having a plurality of inputs coupled to the plurality of outputs of the inlet gas manifold and a plurality of outputs, wherein the plurality of outputs of the inlet heat exchanger provides heated process gases at a temperature of at least 1000° C.;

at least three removable vertical susceptors having a plurality of inputs coupled to the plurality of outputs of the inlet heat exchanger and a plurality of outputs, wherein the heated process gases flow through the at least three removeable vertical susceptors, wherein each of the at least three removable vertical susceptors has at least two wafer pockets for holding SiC wafers for batch mode epitaxial growth, wherein each wafer pocket in the at least three removeable vertical susceptors are tilted at an angle of between 2 to 20 degrees relative to vertical to compensate for depletion of reactants as the heated process gases flow through the at least three removeable vertical susceptors to support substantially even epitaxial growth, wherein unreacted process gases are output at the plurality of outputs of the at least three removeable vertical susceptors;

at least two heat shields in the modular SiC epitaxial reactor configured to support substantially equal temperature operation in the at least three removable vertical susceptors;

a plurality of exhaust heat exchangers having a plurality of inputs coupled to the plurality of outputs of the at least three removeable vertical susceptors and a plurality of outputs, wherein the unreacted process gases output at the plurality of outputs of the plurality of exhaust heat exchangers is at a lower temperature than the unreacted process gases provided to the plurality of inputs of the plurality of exhaust heat exchangers;

an exhaust manifold having a plurality of inputs coupled to the plurality of outputs of the plurality of exhaust heat exchangers and an output for providing unreacted process gases; and a chamber housing the inlet gas manifold, the plurality of inlet heat exchangers, the at least three removeable vertical susceptors, the plurality of exhaust heat exchangers, and the exhaust manifold, wherein an inert gas is provided at the input of the chamber, wherein an inert gas path flows from the input of the chamber through the plurality of exhaust heat exchangers to transfer heat from the unreacted process gases to the inert gas, the heated inert gas then flows from the plurality of exhaust heat exchangers to the plurality of inlet heat exchangers to transfer heat from the inert gas to the process gases, and the inert gas is provided at the output of the chamber, and wherein the inert gas is recirculated from the output of the chamber to the input of the chamber.

* * * * *